United States Patent
Cataldo et al.

(10) Patent No.: US 8,041,979 B2
(45) Date of Patent: Oct. 18, 2011

(54) METHOD AND A SYSTEM FOR SYNCHRONISING RESPECTIVE STATE TRANSITIONS IN A GROUP OF DEVICES

(75) Inventors: James Adam Cataldo, San Jose, CA (US); Bruce Hamilton, Menlo Park, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 816 days.

(21) Appl. No.: 11/926,140

(22) Filed: Oct. 29, 2007

(65) Prior Publication Data

US 2009/0113229 A1 Apr. 30, 2009

(51) Int. Cl.
*G04B 47/06* (2006.01)
*H04B 17/00* (2006.01)

(52) U.S. Cl. ........ 713/400; 703/401; 703/500; 703/501; 703/502; 703/503; 702/79; 702/89; 702/122; 702/123; 702/124; 702/125; 700/306; 370/507; 370/508

(58) Field of Classification Search .................. 713/400, 713/401, 500–503; 370/503, 507, 508; 702/79, 702/89, 122–125; 700/306
See application file for complete search history.

(56) References Cited

U.S. PATENT DOCUMENTS

| | | | |
|---|---|---|---|
| 6,694,143 B1 * | 2/2004 | Beamish et al. | 455/456.1 |
| 7,010,332 B1 * | 3/2006 | Irvin et al. | 455/575.2 |
| 7,336,926 B2 * | 2/2008 | Noda et al. | 455/41.2 |
| 7,437,168 B1 * | 10/2008 | Westfield | 455/456.4 |
| 7,656,294 B2 * | 2/2010 | Boss et al. | 340/540 |
| 2004/0204168 A1 * | 10/2004 | Laurila | 455/569.1 |
| 2006/0019645 A1 * | 1/2006 | Azimi et al. | 455/419 |
| 2007/0260851 A1 * | 11/2007 | Taha et al. | 712/204 |
| 2009/0210729 A1 * | 8/2009 | Adams et al. | 713/320 |
| 2010/0022281 A1 * | 1/2010 | Cohen et al. | 455/569.1 |

* cited by examiner

*Primary Examiner* — M Elamin
(74) *Attorney, Agent, or Firm* — Calvin B. Ward

(57) ABSTRACT

A method of synchronizing respective state transitions in a group of devices including at least one responding device is disclosed. The group of devices is communicatively coupled to an initiating device via a communication network. The method includes the at least one responding device receiving a trigger message from the initiating device. The trigger message includes a state transition time or a time from which a state transition time is obtainable. The method further includes the at least one responding device jointly making a respective state transition at the state transition time. A responding device, and a system including the initiating device and the responding device are also disclosed.

18 Claims, 3 Drawing Sheets

METHOD AND A SYSTEM FOR SYNCHRONISING RESPECTIVE STATE TRANSITIONS IN A GROUP OF DEVICES

BACKGROUND

During testing of a device-under-test (DUT) using a number of measurement instruments, it is sometimes desirable to synchronize tasks on the various instruments so that the tasks are carried out at the same time where necessary. Examples of such tasks are those required for simultaneously measuring the output voltage and output current of a DUT in response to a stimulus signal. To make such measurements in the prior art, a test system including an LXI function generator and two LXI digital multimeters (DMMs) are required. These test and measurement instruments are able to communicate directly with one another via multicast messages to perform time-based measurements. All the instruments will be able to send time-stamped data to one another. With the IEEE 1588 time synchronization protocol, any discrepancies in the clocks in the different instruments can be reduced to less than 50 ns. It is desirable to synchronize operations in these LXI instruments when a DUT arrives at the test system. When the DUT arrives, the function generator outputs a stimulus signal, and when the stimulus signal has settled, the DMMs make their respective measurements. It is important for the DMMs to make the respective measurements at the same time. There are other distributed systems that include interacting devices whose operations are to be synchronized so that, where necessary, at least some of these operations are carried out at the same time.

BRIEF DESCRIPTION OF DRAWINGS

The invention will be better understood with reference to the drawings, in which.

DETAILED DESCRIPTION OF THE EMBODIMENTS

Figure 1:
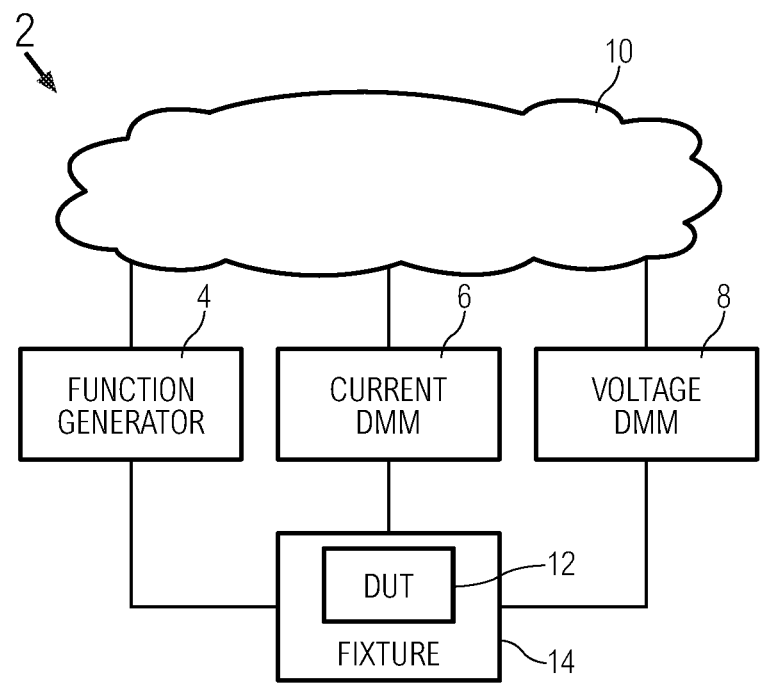
FIG. 1 is a block diagram of a test system of measurement instruments including a function generator and two digital multimeters according to an embodiment of the invention.

As shown in the drawings for purposes of illustration, the invention is embodied in a novel method for synchronizing respective state transitions in a group of devices that include at least one responding device. This at least one responding device is communicatively coupled to an initiating device via a communication network. The method includes the at least one responding device receiving a message from the initiating device. The message includes a state transition time or a time from which a state transition time is obtainable. The method further includes the at least one responding device jointly making a respective state transition at the state transition time. The state transition time may be a time at which each of the at least one responding device is able to or is safe for the device to make the state transition. At least one state transition may include the execution of a respective task therein.

FIG. 1 shows a block diagram of a system 2 that embodies the above described method. The system 2 includes a function generator 4, a first digital multimeter (DMM1) 6, and a second digital multimeter (DMM2) 8 connected to an Ethernet 10. In this test system 2, the function generator 4 functions as the initiating device and the DMMs 6, 8 function as responding devices according to the above described method. The system 2 should not be construed to include only such devices 4, 6, 8; the system 2 may include other devices that are common in a testing environment such as power supplies, oscilloscopes, spectrum analyzers, network analyzers, signal generators, signal analyzers, switch matrices, etc. It should also be noted that the devices 4, 6, 8 may be connected to other types of wired or wireless networks. The method may also be implemented in systems that are non-testing related, such as but not limited to, networked control systems, industrial automation systems, computer networks, and telecommunication systems. Consequently, the devices may include robots, controllers, servers, routers, switches, etc. The system may also be implemented in a single piece of equipment. In such a case, the devices may be separate cards that are connected to a common bus in the equipment, or the devices may be separate hardware or software modules.

In the system 2, the function generator 4 and the DMMs 6, 8 are LXI compliant devices. More specifically, the function generator 4 is an LXI Class A device which includes a standardized LAN interface and a trigger interface (both not shown). The two DMMs 6, 8 are LXI Class B devices, each of which includes a standardized LAN interface. These devices 4, 6, 8 are thus capable of inter-device communication. The function generator 4 and the DMMs 6, 8 support the Precision Time Protocol (PTP) defined in the IEEE 1588-2002 standard. Supporting the IEEE 1588 standard enables these devices 4, 6, 8 to have a sense of time and thus allows the precise synchronization of the devices. Accuracy of time within the nanosecond range can be achieved by using hardware generated timestamps in the devices 4, 6, 8.

During use for simultaneously measuring the voltage and current of a DUT 12 in response to a given stimulus signal, the function generator 4 and the DMMs 6, 8 are connected via a test fixture 14 to the DUT 12. When the DUT 12 is connected to the devices 4, 6, 8, the test fixture 14 triggers the function generator 4 to apply the stimulus signal to the DUT 12. Alternatively, the function generator 4 may be connected to a personal computer (PC) (not shown) and triggered to start the measurements by an operator entering an appropriate command on the PC after connecting the DUT 12 to the test fixture 14. When the stimulus signal stabilizes after some time, the DMMs 6, 8 make their respective voltage and current measurements. In one embodiment, these measurements are taken at precisely the same time to avoid any phase error. The sequence 20 (FIG. 3) of state transitions in the devices 4, 6, 8 for coordinating the respective tasks therein to carry out the voltage and current measurements will be described in more detail shortly.

Figure 2:
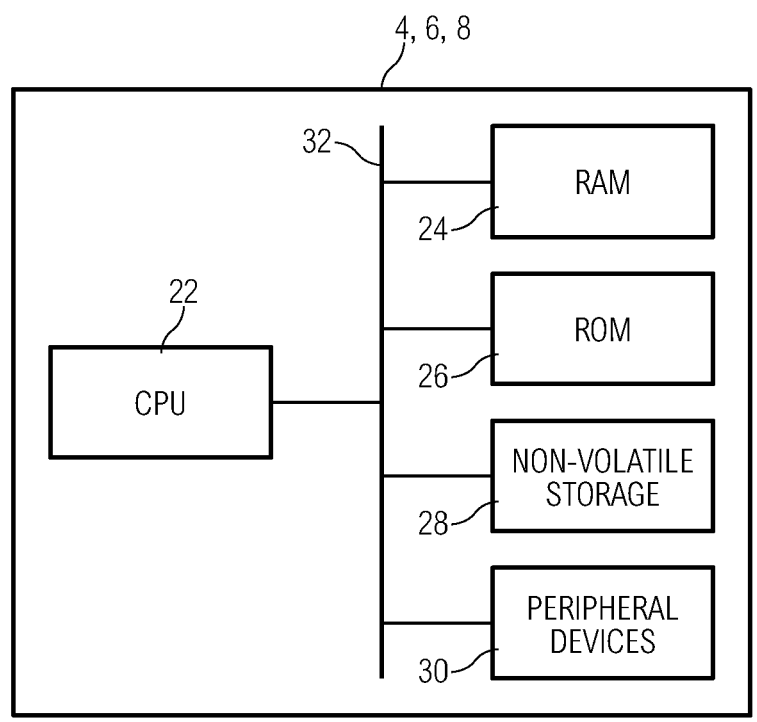
FIG. 2 is a generic block diagram of a measurement instrument in FIG. 1.

With reference to FIG. 2, each of the devices 4, 6, 8 generally includes, among others, a central processing unit (CPU) 22 that is coupled to a random access memory (RAM) 24, a read only memory (ROM) 26, a non-volatile storage unit 28 and other peripheral devices 30 via an internal bus 32. The bus 32 carries data signals, control signals and power to the various components of each device 4, 6, 8. The non-volatile storage unit 28 may be a floppy disk, a compact disc (CD), a chip card, a hard disk or the like. The other peripheral devices 30 may include a display, a keyboard, a mouse, and other device-specific components such as a measurement front-end (all not shown). The display may be a video display, LCD display, touch-sensitive display, or other display types. The ROM 26 or the non-volatile storage unit 28 may serve as a program storage device for storing a program of instructions that is executable by the CPU 22 for implementing the respective portion of the sequence 20. The program may be implemented in any high level or low level programming languages.

The first sequence 20 of state transitions and associated steps implemented in the function generator 4 and the DMMs 6, 8 will be described next with the aid of FIG. 3. The sequence 20 starts at time T0 in the function generator 4 when the function generator 4 receives a trigger signal (not shown) from the test fixture 14 to start the voltage and current measurements on the DUT 12. At this time T0, the function generator 4 is in an IDLE state 60. In this IDLE state 60, the function generator 4 composes and sends a message 61 to the DMMs 6, 8 in a SEND MESSAGE step 62. The message 61 includes an event field (not shown) containing information relating to the arrival of the DUT 12 and a time field (not shown) containing the time the message 61 is composed in the function generator 4. Thereafter, the function generator 4 prepares to transition to an OUTPUT SIGNAL state 64. The message 61 may be sent by multicasting the message 61 to the other devices 6, 8 belonging to a group. Alternatively, any device 4, 6, 8 may send the message 61 to the other devices 4, 6, 8 by unicasting the message 61 to each of the other devices 4, 6, 8.

The DMMs 6, 8 receive the message 61 from the function generator 4 when the DMMs 6, 8 are in their respective IDLE states 63, 65. The DMMs 6, 8 will likewise prepare to transition to respective NO OPERATION states 66, 68. In this embodiment, the function generator 4 and the two DMMs 6, 8 transition to their respective next states a predetermined time interval after the time in the message 61. This predetermined time interval is the longest of the time intervals between the creation of the message 61 by the function generator 4 and each of the function generator 4 and the DMMs 6, 8 being able to make the respective state transition. Specifically, the time interval between the creation of the message 61 by the function generator and a DMM 6, 8 making the state transition is the sum of an upper bound on the time between the creating of the message 61 and the sending of the message 61 at the function generator, an upper bound on the delay in the network for delivering the message 61 from the function generator 4 to the DMM 6, 8, and an upper bound on the time between the receiving of the message 61 and the state transitioning at the DMM 6, 8. By having the predetermined time interval set to the maximum of the upper bounds on the time intervals required for all relevant devices 4, 6, 8 to make a state transition, it is ensured that all the devices 4, 6, 8 can transition to their respective next states at the same time. Assume in this embodiment that the maximum time intervals for the function generator 4, DMM1 6 and DMM2 8 are De0, De1, De2 respectively, where De2>De1>De0. In such a scenario, the longest time interval is that of DMM2, which is De2. When De2 is set as the predetermined time interval for state transition, all three devices 4, 6, 8 will transition to their respective next states at time T1, which is given by a time De2 after the time in the message 61. For simplicity, the time in the message 61 is shown as time T0 in FIG. 3; those skilled in the art would however recognize that the time in the message 61 is some time interval after the time T0. The times in the other messages 71, 81, 83 are similarly shown to be state transition times in FIG. 3 and FIG. 4. The longest time interval De2 may be preprogrammed into each of the devices 4, 6, 8 or may be determined by each device 4, 6, 8 individually from the time intervals De0, De1, De2 of the devices 4, 6, 8 that are preprogrammed therein. The longest time interval for a next state transition may also be included in the message 61 in addition to the time of message creation. Alternatively, the function generator 4 may determine the longest time interval and add it to the time of composing the message 61 and include the resultant state transition time in the message 61.

At time T1, the function generator 4 transitions to the OUTPUT SIGNAL state 64 wherein the function generator 4 outputs a stimulus signal to the DUT 12 in an OUTPUT SIGNAL step 70. When the stimulus signal has settled, the function generator 4 proceeds to send a second message 71 to the DMMs 6, 8 in another SEND MESSAGE step 72. The event field in this second message 71 carries information related to the settling of the stimulus signal generated by the function generator 4. The time field in the second message contains the time this second message is composed. Thereafter, the function generator 4 once again prepares for a state change. The second message 71 may also be sent prior to the settling of the stimulus signal. When the function generator 4 transitions to the OUTPUT SIGNAL state 64 at time T1, the DMMs 6, 8 transition to respective NO OPERATION states 66, 68. When the DMMs 6, 8 receive the second message 71 while in the NO OPERATION states 66, 68, no operation is carried out by the DMMs 6, 8. The DMMs 6, 8 merely prepare to make a state transition at the appropriate time. Specifically, the function generator 4 and the DMMs 6, 8 are all preparing to make a state transition at a time T2, given by a time interval De2 after the time at which the second message is composed.

When time T2 arrives, the function generator 4 transitions to a NO OPERATION state 74 while the DMMs 6, 8 transition to respective MEASURE states 76, 78. In the respective MEASURE state 76, 78, each DMM 6, 8 executes its respective task involving making a measurement. That is, DMM1 6 measures the voltage and DMM2 8 measures the current at the DUT 12 at time T2 in respective MEASURE steps 80, 82. Based on these voltage and current measurements, the power at the DUT 12 for the stimulus signal can be determined. After the measurements have been taken, the DMMs 6, 8 send respective messages 81, 83 to the other devices 4, 6, 8 in the group in respective SEND MESSAGE steps 84, 86. These messages 81, 83 would likewise prime the other devices 4, 6, 8 to make a state change. The time for state transition in the devices 4, 6, 8 is based on the later of the times in the two messages 81, 83. If there are three or more messages, the time for state transition in the devices 4, 6, 8 will accordingly be based on the latest of the times in the messages. In this embodiment, the next time for state change will be a time T3, which is given by the time interval De2 after the later of the two times in two messages 81, 83.

At time T3, the function generator 4 and the DMMs 6, 8 transition to their respective next states 88, 90, 92. The function generator 4 transitions to another OUTPUT SIGNAL state 88 and the DMMs 6, 8 transition to respective NO OPERATION states 90, 92. In the OUTPUT SIGNAL state 88, the function generator 4 outputs a second stimulus signal that is different from the first stimulus signal. The DMMs 6, 8 would then make the respective measurements in respective MEASURE steps 94, 96 when they next transition to respective MEASURE states 98, 100. From the above description, it can be seen that state transitions and associated tasks in the various devices 4, 6, 8 can be synchronized. Whenever one of the devices 4, 6, 8 is ready to make a state change, it sends a message to the other devices 4, 6, 8 in the group to inform these other devices 4, 6, 8 that they can likewise change state at an agreed upon time given by the longest time interval De2 after the time in the time field of the message. In this manner, all devices 4, 6, 8 including the initiating device and the responding devices can make state transitions in synchronism.

Figure 3:
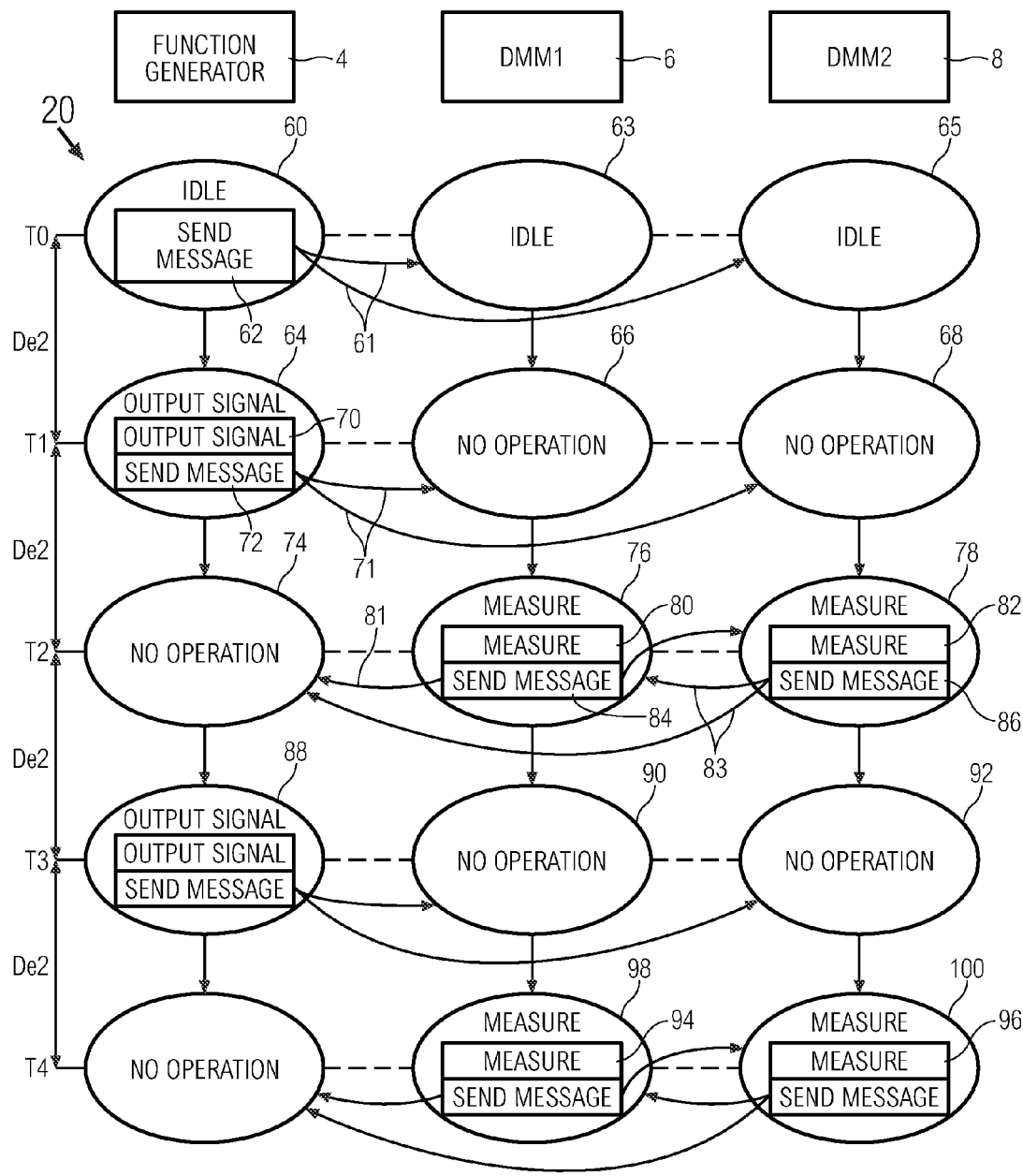
FIG. 3 is a diagram showing a sequence of state transitions, according to another embodiment of the invention, that is implemented in the test system in FIG. 1 for synchronizing operations in the instruments so that the DMMs are able to make respective measurements at the same time.
Figure 4:
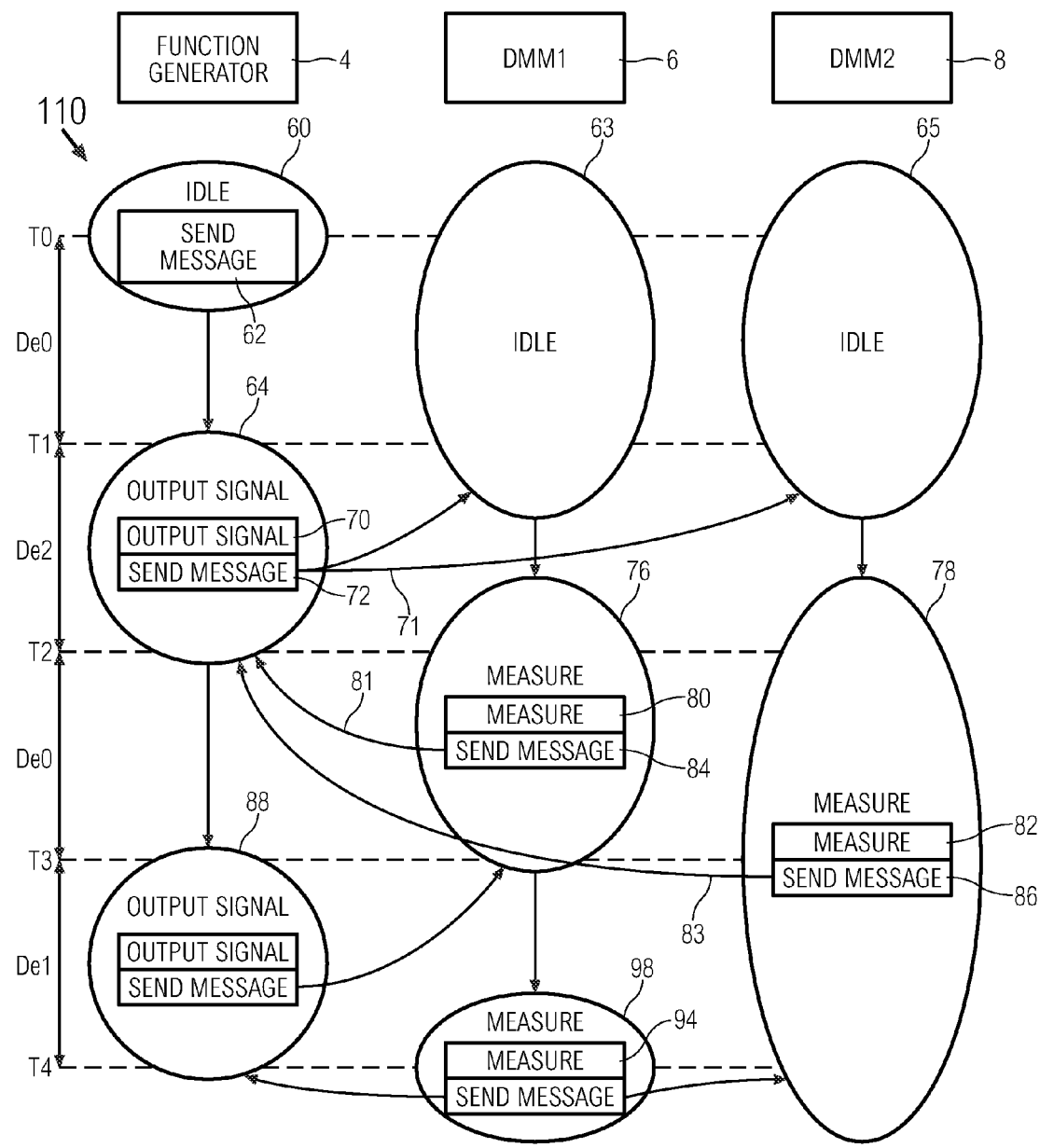
FIG. 4 is a diagram showing another sequence of state transitions for carrying out the same measurements as that in FIG. 3.

In the embodiment in FIG. 3, the devices 4, 6, 8 change states regardless of whether there is a need for such a change of state. In other words, a device transitions to a state even though it has no meaningful task to execute in the new state. FIG. 4 shows a second sequence 110 of state transitions according to another embodiment of the invention where a device 4, 6, 8 changes state only when there is an associated task to be performed in the new state. Moreover, in this embodiment the time or delay for making a state change is not fixed but dependent on which device or devices 4, 6, 8 are making a state change. As in the first sequence 20 described above, the second sequence 110 starts at a time T0 in the function generator 4 when the function generator 4 receives a trigger signal from the test fixture 14 to start the voltage and current measurements on the DUT 12. At this time T0, the function generator 4 is in the IDLE state 60. In this embodiment, no message is sent by the function generator 4. When the trigger signal from the fixture 14 is received, the function generator 4 merely transitions from the IDLE state 60 to the OUTPUT SIGNAL state 64 as soon as it is able to do so. The function generator 4 will, in such a case, make the state transition at a time T1 given approximately by the time interval De0 from the time the trigger signal is received. Compared to the embodiment in FIG. 3, the function generator 4 can make a state transition relatively quickly since it does not have to wait for the DMMs 6, 8 to make the transition together with it.

When the time T1 arrives, the function generator 4 transitions to the OUTPUT SIGNAL state 64 while the DMMs 6, 8 remain in the respective IDLE states 63, 65. The function generator 4 outputs a stimulus signal to the DUT 12 in the OUTPUT SIGNAL step 70. After the signal settles, the function generator 4 sends a message 71 to the DMMs 6, 8 in the SEND MESSAGE step 72. The content of the message is the same as that described above. When the DMMs 6, 8 receive the message, they prepare to change state at the appropriate time. Since the function generator 4 has no task to perform at that time, it remains in the OUTPUT SIGNAL state 64. With the two DMMs 6, 8 preparing to make respective state changes, the time for the next state transition is determined to be the longer of the two time intervals associated with the two DMMs 6, 8, which in this embodiment is the time interval De2. Each device 4, 6, 8 may determine which of the devices 4, 6, 8 will make a state transition based on the event in the message 71 and obtain the time interval accordingly. Alternatively, as mentioned above, the device 4, 6, 8 sending the message may determine the time interval and include it in the message in addition to the time of composition of the message, or the device 4, 6, 8 may add the time interval to the time of composition and include the single resultant time in the message. When the time T2 given by the time interval De2 after the time in the message 71 arrives, the function generator 4 remains in the OUTPUT SIGNAL state 64 while both the DMMs 6, 8 transition to the respective MEASURE states 76, 78. In the MEASURE states 76, 78, the DMMs 6, 8 make their respective measurements in respective MEASURE steps 80, 82. In these steps 80, 82, DMM1 6 measures the voltage and DMM2 8 measures the current. Based on these voltage and current measurements, the power at the DUT 12 for the stimulus signal is then determined. After the measurements are taken, the DMMs 6, 8 send respective messages 81, 83 to the function generator 4, in respective SEND MESSAGE steps 84, 86. These messages 81, 83 or more specifically the times therein are handled by the function generator 4 in a similar manner as that described above. As can be seen so far in this embodiment, a device 4, 6, 8 changes state only when there is a task to be performed in the new state. Similarly at time T3, given by the time interval De0 after the later of the times in the two messages 81, 83 from the DMMs 6, 8, the function generator 4 transitions to the second OUTPUT SIGNAL state 88 while the DMMs 6, 8 remain in their respective MEASURE states 76, 78. In the second OUTPUT SIGNAL state 88, the function generator 4 outputs a second stimulus signal that is different from the first stimulus signal. For this second stimulus signal, only DMM1 6 is required to make a measurement. The function generator 4 therefore sends a message to only DMM1 6. Since DMM1 6 is the only device making a state transition next, the time for state transition T4 is given by the time interval De1 after the time in the latest message received by DMM1 6. At time T4, DMM1 6 transitions to the MEASURE state 98 while the function generator 4 and DMM2 8 remain in their respective states 88, 78. DMM1 6 makes its measurement in the MEASURE step 94. After the time T4 in both the embodiments in FIGS. 3 and 4, the devices 4, 6, 8 may return to their IDLE states 60, 63, 65. In this embodiment, a message is sent by an initiating device to only devices 4, 6, 8 making state transitions. Moreover a device makes a state transition only when there is an action to be performed. The state transition in a device 4, 6, 8 is carried out in step with a corresponding state transition in the other relevant devices 4, 6, 8.

In the above described state transition sequences 20, 110 each device 4, 6, 8 is thus able to synchronize its state transition with the state transitions of the other relevant devices 4, 6, 8. Accordingly, an initiating device 4 includes a means that sends the responding devices a message that includes a time field. Each responding device includes a means that receives the message and a means that makes a respective state transition in response to the message at a transition time. The transition time may be the time specified in the time field of the message. Alternatively, the transition time may be given by a predetermined time interval after the time in the time field of the message. According to one embodiment, the predetermined time interval is the longest time interval from the time in the message required by each responding device in the group for making the respective state transition. These means when implemented in software are stored in the ROM 26 or the non-volatile storage unit 28. Alternatively, these means may be implemented in firmware, hardware (not shown), or a combination thereof.

Although the present invention is described as implemented in the above described embodiments, it is not to be construed to be limited as such. For example, it is described that the function generator 4 and DMMs 6, 8 are LXI compliant devices connected via an Ethernet. This is not necessarily so; the invention may be implemented with devices that can communicate with each other over any network including but not limited to a Controller Area Network (CAN). Furthermore, protocols used by these devices for time synchronization may also include, among others, the Network Time Protocol (NTP).

As another example, it should not be construed that all responding devices 6, 8 in a multicast group receiving the message from the initiating device 8 are required to make a state transition. It is possible to have only a subset of the responding devices 6, 8 making respective state transitions. This subset may be explicitly specified, for example, in the message, or in other types of messages or a combination thereof. When the responding devices 6, 8 are specified in more than one message, the subset may be a union or an intersection of the responding devices 6, 8 specified in the relevant messages. The subset may be determined each time there is a message, or it may be determined less frequently and remain in effect until changed. Alternatively, this subset of devices 6, 8 may be determined via other means internal to each responding device 6, 8, such as, hardware and/or software means that is able to determine if the responding device 6, 8 belongs to the subset of devices 6, 8 required to respond to the message. These means may do so based on the time the respective responding device 6, 8 receives the message or based on the time specified in the message. The time may be specified as a number, string, etc. in the time field in the message. These means within a responding device may also determine if the responding device 6, 8 should respond based on other criteria, such as but not limited to, the state of the responding device 6, 8 and data that may be obtained in a variety of ways.

As yet another example, it should not be construed that only a transition to a single state is possible from any one state. The synchronization of state transitions is possible even for the case where there are more than one possible state transitions from any one state. In such a case, the event in the message would determine which state transition is made.

As yet a further example, it is possible for devices to join and leave the system when the system is in operation. In one embodiment, devices are allowed to join the system only when the time interval between the time in the message and the device making a state transition is shorter than the time interval adopted in the system in operation, for example the time interval De2 in the embodiment in FIG. 3. In other embodiments, it is possible for devices with a time interval that is longer than the time adopted in the system to join. For such embodiments, each time a device joins or leaves the system, the devices remaining in the system would exchange messages containing respective time intervals so that a new and more appropriate time interval may be determined and adopted for use in the system.

What is claimed is:

1. A method of synchronizing respective state transitions in a group of devices comprising at least one responding device that is communicatively coupled to an initiating device via a communication network, the method comprising:
    the at least one responding device receiving a message from the initiating device, the message including a field containing one of a state transition time and a time from which a state transition time is obtainable; and
    the at least one responding device jointly making a respective state transition with the initiating device at the state transition time.

2. A method according to claim 1, wherein at least one state transition comprises executing a task that causes said at least one responding device to make a measurement on a device under test.

3. A method according to claim 1, wherein the message further comprises another field containing information relating to an event, the information being used by the responding device to determine a state to transition to.

4. A method according to claim 1, wherein the time from which a state transition time is obtainable comprises a time when the initiating device composes the message.

5. A method according to claim 4, wherein the state transition time comprises a time that is obtained by adding to the time in the message the longest of the time intervals between the creation of the message by the initiating device and each of the at least one responding device being able to make the state transition.

6. A method according to claim 5, wherein each time interval between the creation of the message by the initiating device and a responding device making the state transition comprises the sum of:
    an upper bound on the time between the creating of the message and the sending of the message at the initiating device;
    an upper bound on the delay in the network for delivering the message from the initiating device to the responding device; and
    an upper bound on the time between the receiving of the message and the state transitioning at the responding device.

7. A device that makes a state transition when initiated by an initiating device communicatively coupled via a communication network to a group of devices including at least the device, the device comprising:
    means that receives a message from the initiating device, the message including a field containing, one of a state transition time and a time from which a state transition time is obtainable, the state transition time being the time at which the group of devices can jointly make a respective state transition; and
    means that makes the state transition at the state transition time, wherein at least one of the group of devices is caused to make a measurement on a device under test at a time determined by the message.

8. A device according to claim 7, wherein the means that makes the state transition comprises a means that executes a task.

9. A device according to claim 7, wherein the message further comprises another field containing information relating to an event and the means that makes the state transition comprises a means that makes a transition to a state that is determined based on the event.

10. A device according to claim 7, wherein, the time from which a state transition time is obtainable comprises a time when the initiating device composes the message.

11. A device according to claim 10, wherein the state transition time comprises a time that is obtained by adding to the time in the message the longest of the time intervals between the creation of the message by the initiating device and each of the devices in the group being able to make the respective state transition.

12. A device according to claim 11, wherein each time interval between the creation of the message by the initiating device and a device in the group making the respective state transition comprises the sum of:
    an upper bound on the time between the creating of the message and the sending of the message at the initiating device;
    an upper bound on the delay in the network for delivering the message from the initiating device to the device; and
    an upper bound on the time between the receiving of the message and the state transitioning, at the device.

13. A system comprising an initiating device cooperating, with a group of at least one responding device to synchronize respective transitions therein, wherein the initiating device comprises:
    means that sends the responding device a message including a field containing one of a state transition time and a time from which a state transition time is obtainable, the state transition time being the time at which the group of devices can jointly make a respective state transition; and
    the responding device comprises:
    means that receives the message; and means that makes a respective transition at the state transition time,
    wherein said responding device is caused to make a measurement on a device under test at a time determined by the state transition time.

14. A system according to claim 13, wherein the means that makes the state transition comprises a means that executes a task.

15. A system according to claim 13, wherein the message further comprises another field containing information relating to an event and the means that makes the state transition comprises a means that makes a transition to a state that is determined based on the event.

16. A system according to claim 13, wherein the time from which a state transition time is obtainable comprises a time when the initiating device composes the message.

17. A system according to claim 16, wherein the state transition time comprises a time that is obtained by adding to the time in the message the longest of the time intervals between the creation of the message by the initiating device and each of the responding devices in the group being able to make the respective state transition.

18. A system according to claim 17, wherein each time interval between the creation of the message by the initiating device and a responding device in the group making the respective state transition comprises the sum of:
    an upper bound on the time between the creating of the message and the sending of the message at the initiating device;
    an upper bound on the delay in the network for delivering the message from the initiating device to the responding device; and
    an upper bound on the time between the receiving of the message and the transitioning at the responding device.

* * * * *

UNITED STATES PATENT AND TRADEMARK OFFICE
CERTIFICATE OF CORRECTION

| | | |
|---|---|---|
| PATENT NO. | : 8,041,979 B2 | Page 1 of 1 |
| APPLICATION NO. | : 11/926140 | |
| DATED | : October 18, 2011 | |
| INVENTOR(S) | : James Adam Cataldo et al. | |

It is certified that error appears in the above-identified patent and that said Letters Patent is hereby corrected as shown below:

On the Title page, in field (54), in "Title", in column 1, line 2, delete "SYNCHRONISING" and insert -- SYNCHRONIZING --, therefor.

In column 1, line 2, delete "SYNCHRONISING" and insert -- SYNCHRONIZING --, therefor.

In column 8, line 19, in Claim 7, delete "containing," and insert -- containing --, therefor.

In column 8, line 36, in Claim 10, delete "wherein," and insert -- wherein --, therefor.

In column 8, line 55, in Claim 12, delete "transitioning," and insert -- transitioning --, therefor.

In column 8, line 56, in Claim 13, delete "cooperating," and insert -- cooperating --, therefor.

Signed and Sealed this
Twenty-ninth Day of November, 2011

David J. Kappos
*Director of the United States Patent and Trademark Office*